(12) United States Patent
Winter et al.

(10) Patent No.: US 8,670,274 B2
(45) Date of Patent: Mar. 11, 2014

(54) DATA STORAGE IN ANALOG MEMORY CELLS USING MODIFIED PASS VOLTAGES

(71) Applicant: Apple Inc., Cupertino, CA (US)

(72) Inventors: Shai Winter, Givatayim (IL); Ofir Shalvi, Ra'anana (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/943,131

(22) Filed: Jul. 16, 2013

(65) Prior Publication Data

US 2013/0301360 A1     Nov. 14, 2013

Related U.S. Application Data

(63) Continuation of application No. 12/534,893, filed on Aug. 4, 2009, now Pat. No. 8,498,151.

(60) Provisional application No. 61/086,225, filed on Aug. 5, 2008, provisional application No. 61/187,676, filed on Jun. 17, 2009.

(51) Int. Cl.
*G11C 11/34* (2006.01)
*G11C 16/06* (2006.01)

(52) U.S. Cl.
USPC ............ 365/185.03; 365/185.02; 365/185.22; 365/185.24

(58) Field of Classification Search
USPC ............. 365/185.03, 185.02, 185.09, 185.22, 365/185.24
See application file for complete search history.

(56) References Cited

U.S. PATENT DOCUMENTS 7,751,240 B2 * 7/2010 Shalvi ...................... 365/185.03
7,924,613 B1 * 4/2011 Sommer et al. .......... 365/185.03
8,151,166 B2 * 4/2012 Shalvi et al. .................. 714/763

* cited by examiner

*Primary Examiner* — Toan Le
(74) *Attorney, Agent, or Firm* — Meyertons, Hood, Kivlin, Kowert & Goetzel, P.C.

(57) ABSTRACT

A method for data storage includes storing data in a target analog memory cell, which is one of a group of analog memory cells that are connected in series with one another, by writing a storage value into the target memory cell. The storage value written into the target memory cell is verified while biasing the other memory cells in the group with respective first pass voltages. After writing and verifying the storage value, the storage value is read from the target memory cell while biasing the other memory cells in the group with respective second pass voltages, wherein at least one of the second pass voltages applied to one of the other memory cells in the group is lower than a respective first pass voltage applied to the one of the other memory cells. The data is reconstructed responsively to the read storage value.

20 Claims, 4 Drawing Sheets

FIG. 9 ions 61/086,225, filed Aug. 5, 2008, and U.S. Provisional
DATA STORAGE IN ANALOG MEMORY CELLS USING MODIFIED PASS VOLTAGES

CROSS-REFERENCE TO RELATED APPLICATIONS

This application is a continuation application of U.S. patent application Ser. No. 12/534,893, filed Aug. 4, 2009, which claims the benefit of U.S. Provisional Patent Application 61/086,225, filed Aug. 5, 2008, and U.S. Provisional Patent Application 61/187,676, filed Jun. 17, 2009, whose disclosures are incorporated herein by reference. This application is related to U.S. patent application Ser. No. 12/534, 898 entitled "Data Storage Using Modified Voltages," which was filed Aug. 4, 2009 and whose disclosure is incorporated herein by reference.

FIELD OF THE INVENTION

The present invention relates generally to memory devices, and particularly to methods and systems for setting pass voltages in programming and readout of analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible programming levels. Higher-density devices, often referred to as Multi-Level Cell (MLC) devices, store two or more bits per memory cell, i.e., can be programmed to assume more than two possible programming levels.

SUMMARY OF THE INVENTION

An embodiment of the present invention provides a method for data storage, including:

storing data in a target analog memory cell, which is one of a group of analog memory cells that are connected in series with one another, by writing a storage value into the target memory cell;

verifying the storage value written into the target memory cell while biasing the other memory cells in the group with respective first pass voltages;

after writing and verifying the storage value, reading the storage value from the target memory cell while biasing the other memory cells in the group with respective second pass voltages, wherein at least one of the second pass voltages applied to one of the other memory cells in the group is lower than a respective first pass voltage applied to the one of the other memory cells; and reconstructing the data responsively to the read storage value.

In an embodiment, the analog memory cells include NAND Flash memory cells, and the group of the analog memory cells includes a NAND string. In a disclosed embodiment, biasing the other memory cells in the group includes applying the lower at least one of the second pass voltages to a memory cell that neighbors the target memory cell.

In some embodiments, biasing the other memory cells includes identifying a subset of the other memory cells in the group, which are unlikely to affect an electrical conductance of the group when biased with the lower at least one of the second pass voltages, and selectively applying the lower at least one of the second pass voltages only to the memory cells in the subset. In an embodiment, the memory cells include multi-level analog memory cells that are each configured to store a predefined number of bits, and identifying the subset includes identifying the memory cells in the group that store less than the predefined number of bits. In an embodiment, the memory cells include multi-level analog memory cells that are each programmed to one of multiple predefined storage value ranges, and identifying the subset includes identifying the memory cells in the group that are programmed to less than a highest range among the storage value ranges.

In some embodiments, at a time of reading the storage value from the target memory cell while biasing the one of the other memory cells with the first pass voltage, the storage value is lower than a minimum readable value, and biasing the one of the other memory cells with the second pass voltage includes reducing the minimum readable value. In an embodiment, the minimum readable value is zero while biasing the one of the other memory cells with the first pass voltage. In another embodiment, reading the storage value includes sensing an electrical conductance of the group of the memory cells while applying a non-negative read voltage to the target memory cell.

In yet another embodiment, reading the storage value includes applying a read voltage to the target memory cell, and biasing the other memory cells includes setting the at least one of the second pass voltages depending on the read voltage. In still another embodiment, reading the storage value includes applying a read voltage to the target memory cell, and biasing the other memory cells includes applying the read voltage to the one of the other memory cells. In an embodiment, the method includes applying the lower at least one of the second pass voltages only responsively to a failure to reconstruct the data while biasing the other memory cells in the group with the first pass voltages.

In some embodiments, the memory cells are included in a memory device, and biasing the other memory cells includes instructing the memory device, using a processor separate from the memory device, to apply the at least one of the second pass voltages. In an embodiment, biasing the other memory cells includes programming a neighboring memory cell in the group to a given storage value, and biasing the neighboring memory cell with a given pass voltage in a vicinity of the given storage value.

There is additionally provided, in accordance with an embodiment of the present invention, a method for data storage, including:

storing data in a target analog memory cell that is one of a group of multi-level analog memory cells, which are each configured to store a respective storage value belonging to a storage value range selected from multiple predefined ranges and which are connected in series with one another, by writing an input storage value into the target memory cell; and reading an output storage value from the target memory cell while biasing the other memory cells in the group with respective pass voltages so as to reconstruct the data, wherein at least one of the pass voltages, which biases at least one of the other memory cells in the group, is set according to the storage value range to which the at least one of the other memory cells belongs.

In some embodiments, biasing the other memory cells in the group includes setting the at least one of the pass voltages to a first value upon determining that the at least one of the other memory cells is programmed to a first storage value range, and setting the at least one of the pass voltages to a second value, lower than the first value, upon determining that the at least one of the other memory cells is programmed to a second storage value range, lower than the first range.

There is also provided, in accordance with an embodiment of the present invention, a method for data storage, including:

storing data in a target analog memory cell, which is one of a group of analog memory cells that are connected in series with one another, by writing an input storage value into the target memory cell;

after storing the data, reading an output storage value from the target memory cell using a read threshold, so as to reconstruct at least some of the data; and while reading the output storage value, biasing at least one of the memory cells in the group, other than the target memory cell, with a pass voltage that depends on the read threshold.

In an embodiment, the at least one of the memory cells includes a memory cell that neighbors the target memory cell.

There is further provided, in accordance with an embodiment of the present invention apparatus for data storage, including:

an interface, which is operative to communicate with a memory including a group of analog memory cells that are connected in series with one another; and circuitry, which is configured to store data in a target analog memory cell in the group by writing a storage value into the target memory cell, to verify the storage value written into the target memory cell while biasing the other memory cells in the group with respective first pass voltages, to read the storage value from the target memory cell, after writing and verifying the storage value, while biasing the other memory cells in the group with respective second pass voltages, wherein at least one of the second pass voltages applied to one of the other memory cells in the group is lower than a respective first pass voltage applied to the one of the other memory cells, and to reconstruct the data responsively to the read storage value.

There is additionally provided, in accordance with an embodiment of the present invention, apparatus for data storage, including:

an interface operative to communicate with a memory including a group of multi-level analog memory cells, which are each configured to store a respective storage value belonging to a storage value range selected from multiple predefined ranges and which are connected in series with one another; and circuitry, which is configured to store data in a target analog memory cell in the group by writing an input storage value into the target memory cell, and to read an output storage value from the target memory cell while biasing the other memory cells in the group with respective pass voltages so as to reconstruct the data, wherein at least one of the pass voltages, which biases at least one of the other memory cells in the group, is set according to the storage value range to which the at least one of the other memory cells belongs.

There is also provided, in accordance with an embodiment of the present invention, apparatus for data storage, including:

an interface, which is operative to communicate with a memory including a group of analog memory cells that are connected in series with one another; and circuitry, which is configured to store data in a target analog memory cell in the group by writing an input storage value into the target memory cell, to read, after storing the data, an output storage value from the target memory cell using a read threshold so as to reconstruct at least some of the data, and, while reading the output storage value, to bias at least one of the memory cells in the group, other than the target memory cell, with a pass voltage that depends on the read threshold.

The present invention will be more fully understood from the following detailed description of the embodiments thereof, taken together with the drawings in which:

DETAILED DESCRIPTION OF EMBODIMENTS

Overview

Data is typically stored in analog memory cells by programming the cells to assume certain quantities of an analog value, also referred to as a storage value, such as an electrical charge or voltage. The analog value stored in the cell can be read by measuring the threshold voltage of the cell, which is defined as the minimal voltage that needs to be applied to the cells' gate in order to cause the cell to reach a given level of electrical conductance.

In many memory devices, analog memory cells are arranged in strings. Each string comprises a group of floating-gate memory cells that are connected source-to-drain in series with one another. This sort of configuration is common, for example, in NAND Flash devices. A particular memory cell can be read by (1) applying a read voltage to the cell's gate, (2) applying respective "pass voltages" to the other memory cells in the string, and (3) measuring the electrical conductance of the string. A memory cell that is read in a certain read operation is referred to herein as a target cell or a selected cell. The other cells in the string, to which the pass voltages are applied, are referred to herein as unselected cells.

Memory devices are often designed to read a plurality of target cells simultaneously (e.g., on the order of 32,000 cells in some NAND Flash devices), wherein each target cell belongs to a different string. The threshold voltage of a given memory cell within a string is sometimes defined as the minimal voltage, which needs to be applied to the cells' gate in order to cause the cell to reach a given level of electrical conductance, assuming the gates of the other cells in the string are biased with nominal pass voltages.

The pass voltages are usually selected to be sufficiently high so that the unselected memory cells in the string will conduct regardless of their charge levels. The read voltage, on the other hand, is typically set to a value lower than the pass voltage, and the value of the read voltage is chosen so that the conductance of the target cell will depend on the charge level of the target cell. In other words, the pass voltages and read voltage are selected so that the conductance of the string will reflect the charge level of the target cell in comparison with the read voltage, regardless of the charge levels of the unselected cells.

Embodiments of the present invention provide improved methods and systems for setting the values of pass voltages used in programming and data readout operations. These methods and systems improve the reading performance of analog memory cell devices.

In some embodiments, data is stored in the target memory cell using an iterative Programming and Verification (P&V) process. For at least one of the unselected cells in the string, the pass voltage applied during data readout is lower than the pass voltage applied during programming verification. Lowering the pass voltage during data readout has an effect of increasing the effective read voltage at the target cell's gate. This effect is important, for example, for reading memory cells that were initially programmed to positive threshold voltages but whose threshold voltages drifted over time and became negative. When the threshold voltage of a given memory cell drifts over time and becomes negative, reading this cell while applying reduced pass voltage to unselected cells enables reliable readout using positive read voltages.

In some cases, reducing the pass voltage creates a risk that some unselected cells will stop conducting, and will therefore modify the conductance of the string and distort the read operation. This risk applies particularly to memory cells that reach high threshold voltages, either intentionally or as a result of unintentional over-programming. In some embodiments, reduction of pass voltages is performed selectively, i.e., only to a subset of the unselected cells. Several methods for identifying cells or strings whose conductance is likely to be affected by pass voltage reduction are described herein.

Another technique that is described herein uses reduced pass voltages to pre-program memory cells to an intermediate programming state before data storage. This technique improves programming accuracy and reduces cross-coupling interference between memory cells. Yet another disclosed method improves the resolution of setting the read voltage by jointly setting the read voltage and pass voltages. In still another method, pass voltage values are set as a function of the read threshold used in the read operation, so as to increase the maximum achievable read voltage.

The methods described herein can be carried out by internal circuitry in the memory device, and/or by an external controller. In some embodiments, the memory device and memory controller support a command interface for instructing the memory device to apply the appropriate pass voltages.

System Description

Figure 1:
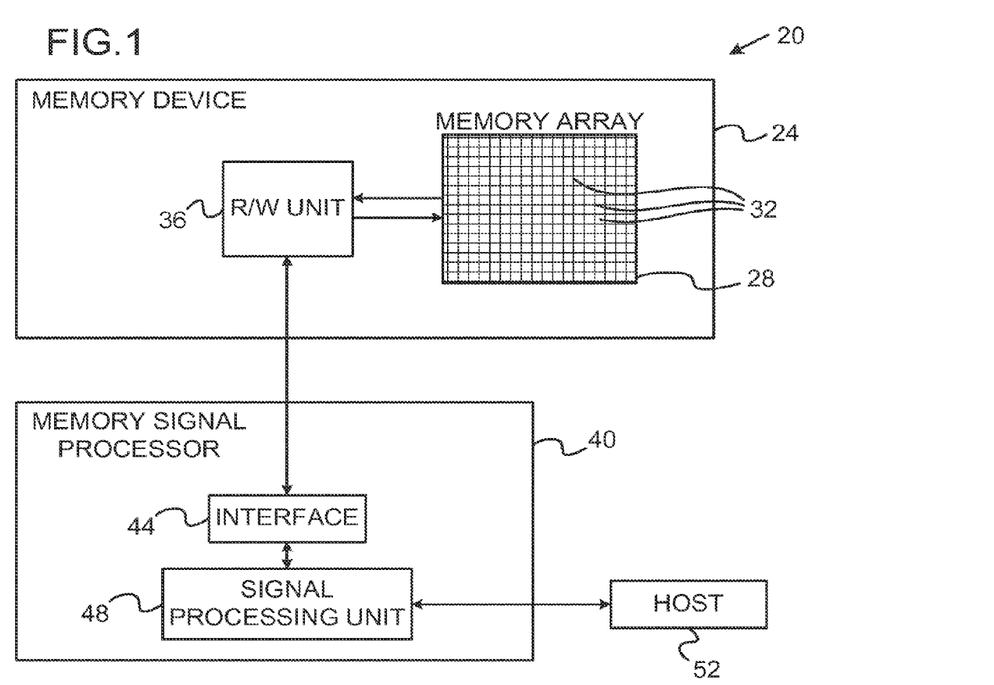
FIG. 1 is a block diagram that schematically illustrates a memory system, in accordance with an embodiment of the present invention.

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array 32 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having a resolution of one or more bits. Data is typically written to and read from the memory cells in groups that are referred to as pages. In some embodiments, the R/W unit can erase a group of cells 32 by applying one or more negative erasure pulses to the cells.

The storage and retrieval of data in and out of memory device 24 is performed by a Memory Signal Processor (MSP) 40. MSP 40 comprises an interface 44 for communicating with memory device 24, and a signal processing unit 48, which processes the data that is written into and read from device 24. In some embodiments, unit 48 encodes the data for storage using a suitable Error Correction Code (ECC) and decodes the ECC of data retrieved from the memory. In some embodiments, unit 48 produces the storage values for storing in the memory cells and provides these values to R/W unit 36. Alternatively, unit 48 provides the data for storage, and the conversion to storage values is carried out by the R/W unit internally to the memory device. Alternatively to using an MSP, the methods described herein can be carried out by any suitable type of memory controller.

MSP 40 communicates with a host 52, for accepting data for storage in the memory device and for outputting data retrieved from the memory device. MSP 40, and in particular unit 48, may be implemented in hardware. Alternatively, MSP 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 40 are implemented as two separate Integrated Circuits (ICs). In alternative embodiments, however, the memory device and the MSP may be integrated on separate semiconductor dies in a single Multi-Chip Package (MCP) or System on Chip (SoC), and may be interconnected by an internal bus. Further alternatively, some or all of the MSP circuitry may reside on the same die on which the memory array is disposed. Further alternatively, some or all of the functionality of MSP 40 can be implemented in software and carried out by a processor or other element of the host system. In some embodiments, host 44 and MSP 40 may be fabricated on the same die, or on separate dies in the same device package.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. In some embodiments, the transistors along each column are divided into serially-connected strings, as will be explained in detail further below.

The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells. In a typical implementation, a two-bit-per-cell memory device may have four pages per row, a three-bit-per-cell memory device may have six pages per row, and a four-bit-per-cell memory device may have eight pages per row.

Erasing of cells is usually carried out in blocks that contain multiple pages. Typical memory devices may comprise several thousand erasure blocks. In a typical two-bit-per-cell MLC device, each erasure block is on the order of 32 word lines, each comprising several thousand cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used.

Some memory devices comprise two or more separate memory cell arrays, often referred to as planes. Since each plane has a certain "busy" period between successive write operations, data can be written alternately to the different planes in order to increase programming speed.

Memory Cell Strings and Word-Line Biasing

Figure 2:
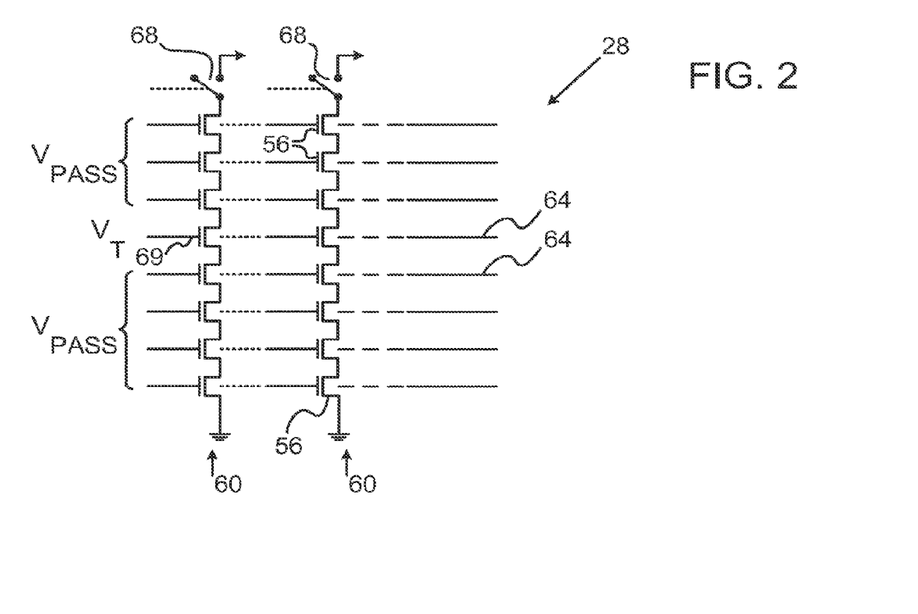
FIG. 2 is a circuit diagram that schematically illustrates an analog memory cell array, in accordance with an embodiment of the present invention.

FIG. 2 is a circuit diagram that schematically illustrates an example implementation of memory cell array 28, in accordance with an embodiment of the present invention. In the present example, each memory cell comprises a floating gate Metal-Oxide Semiconductor (MOS) transistor 56. The memory cells in each column of array 28 (i.e., the memory cells of each bit line) are divided into groups, which are referred to as strings 60. Grouping of memory cells in strings is typical of NAND Flash memory devices, in which the strings are commonly referred to as NAND strings. A NAND string may comprise any suitable number of memory cells, e.g., thirty-two cells.

A certain amount of electrical charge (electrons or holes) can be stored in a particular cell by applying appropriate voltage levels to the transistor gate, source and drain. The value stored in the cell can be read by measuring the threshold voltage of the cell (denoted $V_{TH}$), which is defined as the minimal voltage that needs to be applied to the gate of the transistor in order to cause the transistor to reach a given level of electrical conductance, assuming the gates of the other cells in the string are biased with nominal pass voltages. The read threshold voltage is indicative of the charge stored in the cell.

In each string 60, the memory cells (transistors 56) are connected source-to-drain in series with one another. The source of the first memory cell in the string is connected to the bit line via a string selection switch 68. The string selection switch is controlled by R/W unit 36, which typically closes the switch when accessing memory cells in the strings and opens the switch otherwise. (A given bit line is typically connected to multiple strings.) The drain of the last memory cell in the string is connected to ground. Gates 69 of the memory cells along each row of the array are connected to a respective word line 64. As can be seen in the figure, each memory cell in the row belongs to a different string.

R/W unit 36 typically reads the threshold voltage of a given memory cell (which represents the charge level, and thus the data stored in the cell) by:

Applying a read voltage, denoted $V_T$, to the word line to which the memory cell belongs. This word line is referred to as a selected word line or target word line.

Applying a pass voltage, denoted $V_{PASS}$, to the word lines to which the other memory cells in the string belong. These word lines are referred to as unselected word lines.

Pre-charging the bit line in question.

Connecting the string to which the memory cell belongs to the bit line using the appropriate string select switch 68.

Measuring the electrical conductance of the string by allowing it to discharge and sensing the bit line current after a certain time period. The string conductance under these conditions is indicative of the charge level of the memory cell belonging to the selected word line.

This sort of read operation is typically applied in parallel to multiple cells along a given word line, often to the entire word line. Reading a memory cell by applying voltage $V_T$ forms a certain read threshold, and the result of the read operation indicates whether the threshold voltage of the read memory cell is lower than $V_T$ (in which case the string will conduct) or higher than $V_T$ (in which case the string will not conduct). The pass voltages $V_{PASS}$ are typically selected to be sufficiently high, so that the memory cells other than the cell being read will conduct regardless of their charge levels threshold voltages.

Programming and Reading Memory Cells with Different Pass Voltages

In some embodiments, R/W unit 36 programs a group of memory cells (e.g., an entire word line) by applying an iterative Programming and Verification (P&V) process. In such a process, the R/W unit applies to the word line a sequence of programming pulses, which gradually increase the charge levels of the programmed memory cells. After each programming iteration, the threshold voltages of the memory cells are sensed (verified). Cells that have reached their intended charge levels (threshold voltages) are inhibited from receiving subsequent programming pulses. In each iteration, the R/W unit applies programming pulses selectively. Typically, the R/W unit inhibits memory cells, which have already reached their intended charge levels, from being subjected to subsequent programming pulses.

Thus, R/W unit 36 may read the threshold voltages of memory cells in a given word line in two different scenarios:
In order to retrieve the data stored in the cells, e.g., in response to a request from the MSP.
In order to verify the charge levels of the cells, as part of an iterative programming process.

In some embodiments, R/W unit 36 uses certain values of $V_{PASS}$ for read operations that are intended to verify programmed charge levels, and lower $V_{PASS}$ values for read operations that are intended to retrieve data from the memory cells. This condition applies for at least one of the unselected word lines. In some scenarios that are demonstrated below, performing data retrieval using lower pass voltages than those used for programming verification can improve the readout performance, e.g., reduce the probability of read errors.

Figure 3:
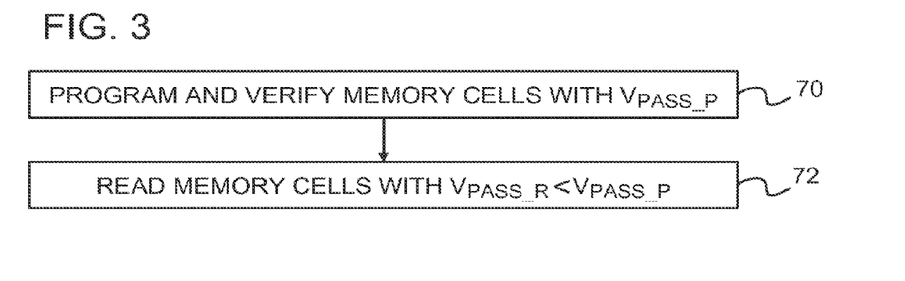
FIG. 3 is a flow chart that schematically illustrates a method for data storage in analog memory cells, in accordance with an embodiment of the present invention.

FIG. 3 is a flow chart that schematically illustrates a method for data storage in analog memory cells, in accordance with an embodiment of the present invention. The method begins with R/W unit 36 storing data in a group of memory cells along a certain word line using an iterative P&V process, at a programming step 70. When verifying the programmed charge levels of the memory cells, the R/W unit applies pass voltages denoted $V_{PASS}$ to the unselected word lines.

At a later point in time, the R/W unit is requested to retrieve the data stored in the group of memory cells. In response to the request, the R/W unit reads the threshold voltages of the memory cells in the group, at a retrieval step 72. During the data retrieval operation, the R/W unit applies pass voltages denoted $V_{PASS\_R}$ to the unselected word lines.

For at least one of the word lines, the R/W unit uses a certain pass voltage for programming verification, and a lower pass voltage for data retrieval. (Generally, in a given verification or retrieval operation, $V_{PASS}$ values may differ from one unselected word line to another.) Thus, in other words, the R/W unit applies pass voltages to the unselected word lines during programming verification and data retrieval, such that $V_{PASS\_R} < V_{PASS\_P}$ for at least one unselected word line.

Figure 4:
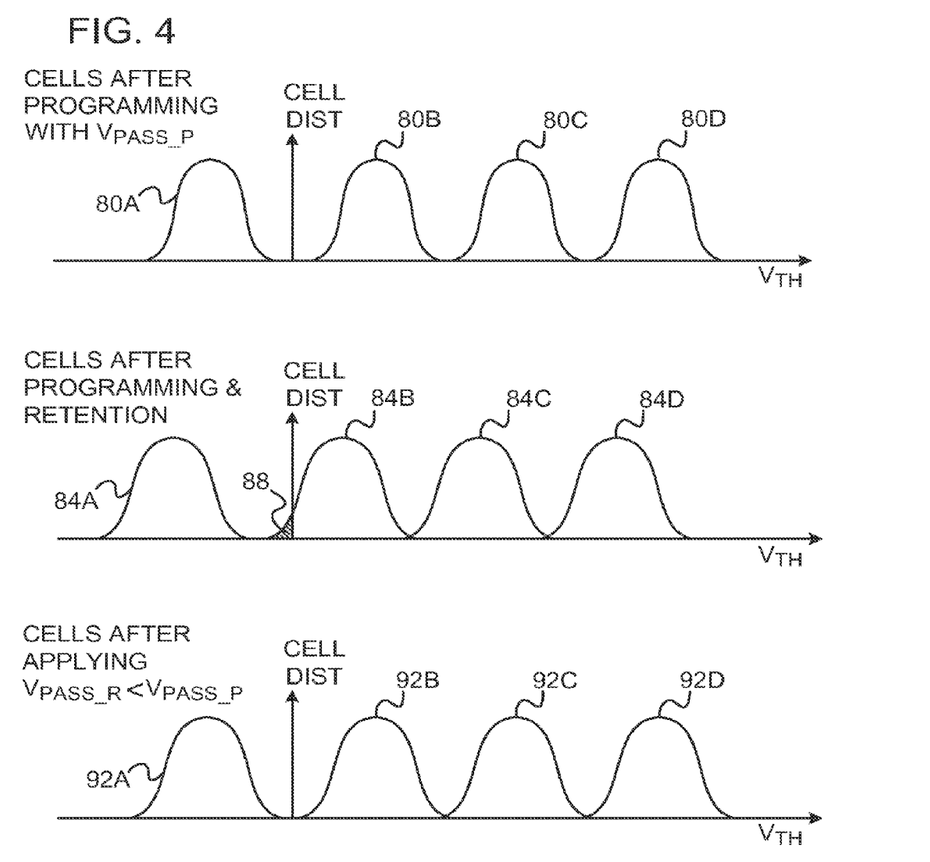
FIG. 4 is a graph showing threshold voltage distributions in a group of analog memory cells, in accordance with an embodiment of the present invention.

FIG. 4 is a graph showing threshold voltage distributions in a group of analog memory cells along a certain word line, in accordance with an embodiment of the present invention. The example of FIG. 4 demonstrates the advantage of performing data retrieval using lower pass voltages. The present example refers to a group of four-level memory cells, each storing two bits of data. The techniques described herein can be used, however, in a similar manner with memory cells that store data in any desired number of programming levels, such as Single-Level Cells (SLC), eight-level cells or sixteen-level cells.

The top graph in FIG. 4 shows the distribution of threshold voltages in the group of memory cells shortly after programming. The four possible two-bit data combinations are represented by four respective programming levels, having respective threshold voltage distributions 80A . . . 80D. In a certain implementation, for example, a cell whose threshold voltage is in distribution 80A is regarded as holding the data "11", a cell whose threshold voltage is in distribution 80B is regarded as holding the data "10", a memory cell whose threshold voltage is in distribution 80C is regarded as holding the data "00", and a memory cell whose threshold voltage is in distribution 80D is regarded as holding the data "01". In some embodiments, distribution 80A, which occupies negative threshold voltages, also represents erased cells.

Typically, R/W 36 retrieves the data stored in the memory cells by comparing the cells' threshold voltages to one or more read thresholds. The R/W unit usually attempts to position the read thresholds in boundary regions between adjacent distributions, so as to differentiate between the programming levels. For example, a read threshold set at $V_{TH}=0V$ can differentiate between memory cells in distribution 80A and memory cells in distribution 80B, since distribution 80A occupies a range of positive threshold voltages and distribution 80B occupies a range of negative threshold voltages.

In many memory device implementations, the R/W unit can set only non-negative read thresholds. This limitation is usually not problematic immediately after programming, but may become problematic after a certain retention period of after neighboring word lines have been programmed. Consider, for example, the middle graph of FIG. 4, which shows the threshold voltage distribution in the group of cells after a certain retention period. During the time that elapsed since the cells were programmed, the cell threshold voltages have drifted due to charge leakage from the cells. As a result, distributions 80A . . . 80D have changed to respective distributions 84A . . . 84D. As can be seen in the figure, distributions 84A . . . 84D have drifted to the left (i.e., have lower threshold voltages that the respective distributions 80A . . . 80D), and are also broader. In particular, the threshold voltages of some of the cells in distribution 84B (shown as a region 88) have drifted below $V_{TH}=0V$ and became negative.

(More strictly speaking, the horizontal axis of the middle graph of FIG. 4 (distributions 84A . . . 84D) denotes the (minimal) voltage that needs to be applied to the word line of the target cells in order to cause the string to conduct when $V_{PASS\_R} < V_{PASS\_P}$. The horizontal axis of the lower graph of FIG. 4 (distributions 92A . . . 92D) denotes the minimal voltage that needs to be applied to the word line of the target cells in order to cause the string to conduct when $V_{PASS\_R} < V_{PASS\_P}$).

In this situation, a read threshold positioned at $V_{TH}=0V$ would not differentiate well between distributions 84A and 84B, because cells in distribution 84B whose threshold voltages are in region 88 would be erroneously associated with distribution 84A. Since R/W unit 36 is only able to use non-negative read thresholds, any read threshold setting would produce read errors. Similar broadening and/or shifting of threshold voltage distribution may also be caused by interference from other memory cells or by other kinds of impairments.

In order to retrieve the data successfully in the presence of such impairments, R/W unit 36 may reduce one or more of the pass voltages applied to the unselected word lines when reading the group of memory cells. Reducing the pass voltages applied to unselected word lines has an effect of shifting the threshold voltages of the cells in the selected word line.

This shifting effect can be modeled by an "effective read voltage" denoted $V_{EFF}$, which depends on $V_{PASS}$ and may be negative. A possible relation between $V_{EFF}$ and $V_{PASS}$ is $V_{EFF}=V_T+b\cdot V_{PASS}$. $V_T$ denotes, as defined above, the read voltage applied to the selected word line. The effect of $V_{PASS}$ of the effective gate voltage may be caused, for example, by electrical coupling between word lines (and in particular neighboring word lines), by changes in the conductance of strings 60 as a function of $V_{PASS}$, and/or by any other effect.

The effect of lowering the $V_{PASS}$ of unselected word lines is shown in the bottom graph of FIG. 4. In this graph, distributions 92A ... 92B show the threshold voltage distribution in the group of memory cells, after lowering the pass voltage of at least one unselected word line in comparison with the pass voltage used for programming verification. In other words, the group of memory cells was programmed and verified with $V_{PASS}$ values denoted $V_{PASS\_P}$ to produce distributions 80A ... 80D.

After retention, the memory cells are read while applying $V_{PASS}$ values denoted $V_{PASS\_R}$, wherein $V_{PASS\_R} < V_{PASS\_P}$ for at least one of the unselected word lines. Distributions 92A ... 92D show the threshold voltage distributions when the memory cells are read. As can be seen in the figure, applying the reduced $V_{PASS}$ values shifts the threshold voltage distributions in the positive direction (distributions 92A ... 92D in comparison with distributions 88A ... 88D). In particular, unlike distribution 84B, distribution 92B now occupies an interval of positive (or at least non-negative) threshold voltages. As a result, R/W unit 36 can now differentiate between distributions 92A and 92B by positioning a read threshold at $V_{TH}$=0V. Since region 88 is eliminated, the stored data can be read with low error probability.

In some cases, applying $V_{PASS\_R} < V_{PASS\_P}$ does not eliminate region 88 completely, i.e., does not shift distribution 92B entirely to the positive side of the threshold voltage axis. Still, even if region 88 is only reduced but not eliminated completely, applying $V_{PASS\_R} < V_{PASS\_P}$ reduces the probability of read errors considerably.

In addition to improving reading performance, the above-described technique can be used for generally differentiating between erased memory cells (e.g., cell belonging to distribution 80A) and cells that were programmed to a positive threshold voltage (e.g., cells belonging to distribution 80B) but whose threshold voltages drifted and became negative. Assume, for example, that the pass voltage used in programming verification is 6V, that the pass voltage used in data retrieval is 5V, and that the effective read voltage can be modeled as $V_{EFF} = V_T + b \cdot V_{PASS}$. In such a case, reading with reduced pass voltages enables the R/W unit to effectively set a read threshold at $-b$ volts.

Selective Application of Reduced Pass Voltages

As noted above, reading memory cells while applying reduced pass voltages to unselected word lines enables system 20 to recover threshold voltages that have drifted and became negative, and thus improve reading performance. On the other hand, reducing pass voltages indiscriminately may sometimes degrade the reading performance.

Consider, for example, a memory cell that belongs to an unselected word line and has a high threshold voltage. Such a memory cell may comprise, for example, a cell that was programmed to the programming level that is associated with the highest threshold voltages (e.g., distribution 80D in FIG. 4). In particular, such a cell may be over-programmed, i.e., programmed to an exceedingly high threshold voltage in comparison with other cells in the same programming level. Applying a reduced pass voltage to such a memory cell may reduce its conductance, because of the high threshold voltage of the cell. As a result, the conductance of the entire string may be affected, and the read operation may be distorted.

Thus, in some embodiments, R/W unit 36 applies reduced pass voltages to unselected word lines selectively. Reduced pass voltages are applied only to the memory cells whose conductance is unlikely to be affected by the pass voltage reduction. The pass voltages of the other cells (typically cells having high threshold voltages) are not reduced.

Figure 5:
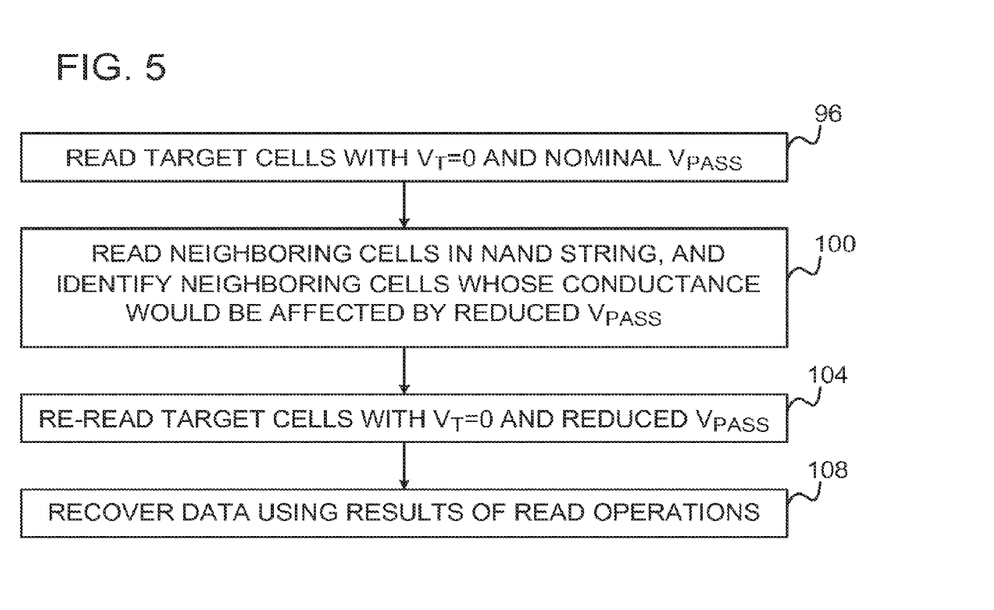
FIGS. 5-7 are flow charts that schematically illustrate methods for reading analog memory cells, in accordance with embodiments of the present invention.

FIG. 5 is a flow chart that schematically illustrates a method for reading analog memory cells, in accordance with an embodiment of the present invention. The method addresses the task of reading a group of memory cells with a read threshold in the vicinity of $V_T$=0V, e.g., a task of differentiation between distributions 80A and 80B in the example of FIG. 4. The memory cells to be read are referred to as target cells, and the selected word line comprising these cells is also referred to as a target word line.

The method begins with R/W unit 36 reading the target cells, at a first reading step 96. This read operation is carried out by applying nominal pass voltages to the unselected word lines and applying $V_T$=0V to the selected word line (i.e., to the target cells).

The R/W unit attempts to identify memory cells in the unselected word lines, whose conductance is likely to be affected (reduced) by reducing $V_{PASS}$, at a second reading step 100. In order to identify these cells, the R/W unit reads the threshold voltages of the memory cells in one or more of the unselected word lines, typically word lines that neighbor the target word line. Based on the threshold voltages of the cells in the unselected word lines, the R/W unit identifies cells whose conductance is likely to be reduced as a result of reducing $V_{PASS}$. For example, the R/W unit may regard cells whose threshold voltages are higher than a certain predefined value as likely to be affected. This predefined value may depend on the intended reduced $V_{PASS}$ value.

The R/W unit re-reads the target cells using reduced pass voltages, at a third reading step 104. The selected word line is read with $V_T$=0V as in step 96 above. In the present read operation, however, the R/W unit applies reduced pass voltages to the unselected word lines. The third reading operation can be viewed, as explained above, as reading the target cells with $V_{EFF} < 0V$.

R/W unit 36 recovers the data stored in the target cells based on the results of the three read operations of steps 96-104 (which may generally be performed in any desired order), at a data recovery step 108. In other words, the R/W recovers the data of a given target cell based on (1) the read result of the target cell using nominal pass voltages, (2) the read result of the target cell using reduced pass voltages, and (3) the assessment as to whether at least one other cell in the string of the target cell is likely to distort the read operation that uses reduced pass voltages. The recovered data is typically output to MSP 40, and then to host 52. In some embodiments, step 108 can be performed by R/W unit 36 in the memory device. Alternatively, MSP 40 carries out step 108, i.e., recovers the data by using the results of the three read operations of steps 96, 100 and 104.

In some embodiments, the R/W unit classifies the target cells into four classes based on the results of the three read operations of steps 96-104:

Class A: Target cells for which the first read operation concluded that $V_{TH} > 0$. For these cells, the second and third read operations usually do not contribute useful information.

Class B: Target cells for which (1) the first read operation concluded that $V_{TH} < 0$, and (2) the second read operation identified at least one cell in the same string that is likely to be affected by reducing $V_{PASS}$. For these cells, the third read operation (with reduced $V_{PASS}$) typically cannot be relied upon. In other words, the threshold voltage of these cells is known to be negative, but they cannot be read reliably with reduced $V_{PASS}$ to determine whether they are higher or lower than $V_{EFF}$.

Class C: Target cell for which (1) the first read operation concluded that $V_{TH}<0$, (2) the second read operation did not identify any cells in the same string that is likely to be affected by reducing $V_{PASS}$, and (3) the third read operation concluded that $V_{TH}>V_{EFF}$. In other words, for these cells it is known that $V_{EFF}<V_{TH}<0$.

Class D: Target cell for which (1) the first read operation concluded that $V_{TH}<0$, (2) the second read operation did not identify any cells in the same string that is likely to be affected by reducing $V_{PASS}$, and (3) the third read operation concluded that $V_{TH}<V_{EFF}$. In other words, for these cells it is known that $V_{TH}<V_{EFF}<0$.

The R/W unit recovers the data from a given target cell based on the class with which the target cell is associated. The R/W unit may apply any suitable decoding scheme that depends on the cell classification. In FIG. 4 above, for example, assume that distribution 80A (as well as 84A and 92A) is associated with a data value D1, and that distribution 80B (as well as 84B and 92B) is associated with a data value D2. The R/W unit may apply the following decoding logic:

TABLE 1

Example decoding logic

| Class of target cell | Decoding decision |
| --- | --- |
| A | D2, possibly with high confidence level |
| B | D1, possibly with low confidence level |
| C | D2, possibly with medium confidence level |
| D | D1, possibly with high confidence level |

In some embodiments, the R/W unit assigns a certain confidence level to the read result of each target cell, based on the read operations using nominal and reduced $V_{PASS}$, and on the assessment as to the likelihood of distortion caused by reducing $V_{PASS}$. In the present example, the R/W unit assigns the confidence level based on the class with which the target cell is associated. The final decision as to the data stored in the target cells may depend on the respective confidence levels assigned to the cells. Various kinds of confidence levels, such as Likelihood Ratios (LRs) or Log-Likelihood Ratios (LLRs), can be used for this purpose.

In some embodiments, MSP 40 encodes the data with an Error Correction Code (ECC) before it is stored in memory device 24, and decodes the ECC of data retrieved from the memory device. In these embodiments, the ECC decoding process carried out by the MSP may consider the confidence levels assigned to the target cells. In other words, the values read from target cells having high confidence levels are given higher weight in the ECC decoding process, in comparison with values read from target cells having low confidence levels. In an example embodiment, target cells having low confidence levels are marked as "erasures," i.e., missing values, to the ECC decoding process. The ECC decoding process decodes the ECC using the erasure indications. Some ECC types, e.g., Reed-Solomon (RS) codes, achieve considerably superior decoding performance when provided with erasure indications. Other ECC types operate on soft confidence levels, such as LLRs.

Alternatively, the R/W unit may select, for each cell, whether to use (output) the read result of step 96 or of step 104, based on the class with which the cell is associated.

Figure 6:
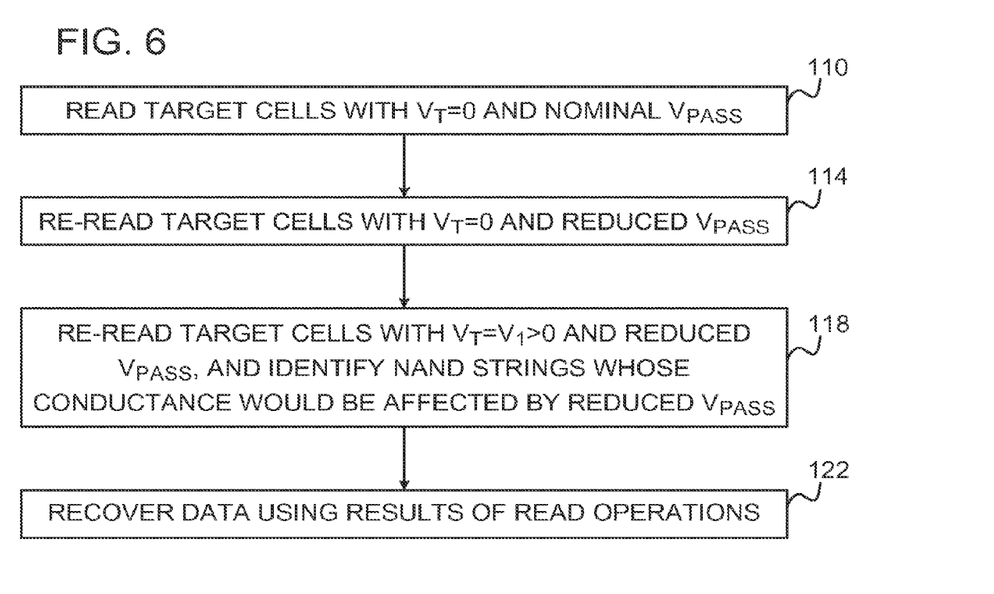

FIG. 6 is a flow chart that schematically illustrates another method for reading analog memory cells, in accordance with an alternative embodiment of the present invention. This method differs from the method of FIG. 5 above in the way in which R/W unit 36 identifies which cells belong to strings that are likely to be affected by reducing $V_{PASS}$.

The method of FIG. 6 begins with R/W unit 36 reading the target cells, at a reading step 110. As in step 96 of FIG. 5 above, in this read operation the R/W unit applies nominal pass voltages to the unselected word lines and $V_T=0V$ to the selected word line (i.e., to the target cells). The R/W unit re-reads the target cells using reduced pass voltages, at a re-reading step 114. In this read operation, the selected word line is read with $V_T=0V$, and the unselected word lines are biased with reduced pass voltages. This reading operation can thus be viewed as reading the target cells with $V_{EFF}<0V$.

The R/W unit attempts to identify one or more strings, whose conductance is likely to be affected (reduced) by reducing $V_{PASS}$, at a string assessment step 118. In order to identify such strings, the R/W unit re-reads the target memory cells with a read voltage that is higher than 0V, i.e., using $V_T=V_1>0V$. The unselected word lines are biased with the reduced pass voltages during this read operation.

Assume that, for a given target cell, the R/W unit reads $V_{TH}<0$ at step 110 (using nominal pass voltages and $V_T=0$), but reads $V_{TH}>V_1$ at step 118 (using reduced pass voltages and $V_T=V_1$). This sort of result indicates that the string of this target cell contains at least one memory cell that stopped conducting as a result of reducing $V_{PASS}$. Thus, R/W unit 36 may use this technique to identify strings whose conductance is likely to be affected (reduced) by reducing $V_{PASS}$.

R/W unit 36 recovers the data stored in the target cells based on the results of the three read operations of steps 110-118 (which may be performed in any desired order), at a recovery step 122. In other words, the R/W recovers the data of a given target cell based on (1) the read result of the target cell using nominal pass voltages, (2) the read result of the target cell using reduced pass voltages, and (3) the assessment as to which strings are likely to distort the read operation that uses reduced pass voltages. The recovered data is typically output to MSP 40, and then provided to host 52.

In some embodiments, the R/W unit classifies the target cells into four classes based on the results of the three read operations of steps 110-118:

Class A: Target cells for which the first read operation concluded that $V_{TH}>0$.

Class B: Target cells for which (1) the first read operation concluded that $V_{TH}<0$, and (2) the third read operation concluded that $V_{TH}>V_1$, Class C: Target cell for which (1) the first read operation concluded that $V_{TH}<0$, (2) the second read operation concluded that $V_{TH}>V_{EFF}$, and (3) the third read operation concluded that $V_{TH}<V_1$, i.e., that the string of the target cell is unlikely to stop conducting as a result of reducing $V_{PASS}$. In other words, for these cells it is known that $V_{EFF}<V_{TH}<0$.

Class D: Target cell for which (1) the first read operation concluded that $V_{TH}<0$, (2) the second read operation concluded that $V_{TH}<V_{EFF}$, and (3) the third read operation concluded that $V_{TH}<V_1$, i.e., that the string of the target cell is unlikely to stop conducting as a result of reducing $V_{PASS}$. In other words, for these cells it is known that $V_{TH}<V_{EFF}<0$.

In some embodiments, R/W unit 36 recovers the data from a given target cell based on the class with which the target cell is associated. The R/W unit may apply any suitable decoding scheme that depends on the cell classification, such as the decoding logic given in Table 1 above. In this example too, the R/W unit may assign respective confidence levels (e.g., LLRs) to the read results of the target cells based on the read operations using nominal and reduced $V_{PASS}$, and on the assessment as to the likelihood of distortion caused by reducing $V_{PASS}$. In particular, the R/W unit may assign a confidence level to a given target cell based on the class with which the cell is associated. The MSP may decode the data (e.g., apply ECC decoding) based on the confidence levels, as explained above. Alternatively, the R/W unit may select, for each cell, whether to use (output) the read result of step 110 or of step 114, based on the class with which the cell is associated.

In some embodiments, the R/W unit may carry out steps 114 and 118 of FIG. 6 using a single read operation, which uses two read thresholds simultaneously. For example, some MLC devices support a read command, which compares the cell storage values to two read thresholds simultaneously. The read results of this read command indicate whether each storage value falls below both read thresholds, above both read thresholds or between the two read thresholds. Thus, the R/W unit may carry out steps 114 and 118 jointly by setting one read threshold to $V_T=0V$ and the other to $V_T=V_1$. The unselected word lines are biased with reduced pass voltages during the read operation.

The methods of FIGS. 5 and 6 above can be applied in an iterative manner, in which the R/W unit reduces the $V_{PASS}$ value from one iteration to the next. This sort of process attempts to find the lowest $V_{PASS}$ values (and thus the lowest $V_{EFF}$) for which the target cells can still be read reliably. The iterative process may be terminated (by the R/W unit or by the MSP) using any suitable stopping condition. For example, the R/W unit may stop lowering the pass voltages upon receiving an indication that the number of errors corrected by the ECC is too high, that ECC decoding has failed, or that an error detection code (e.g., Cyclic Redundancy check—CRC) has failed. As another example, the MSP or R/W unit may hold the (known or estimated) number of memory cells that were programmed to the negative programming state (e.g., in distribution 80A of FIG. 4), count the number of cells whose threshold voltages are currently negative (the cells in distribution 84A, plus the cells in region 88), and stop lowering pass voltages when the two numbers are sufficiently close to one another. This latter comparison can also be used for initiating the iterative process. As yet another example, the R/W unit may stop the iterative process when the number (or percentage) of non-conducting strings becomes too large, or after a predefined maximum number of iterations.

In some embodiments, system 20 may modify the pass voltages, either iteratively or not, only in response to a failure to reconstruct the data using the nominal pass voltages. Such a failure may be detected, for example, using ECC or CRC failure, or using any other suitable means.

The methods of FIGS. 5 and 6 may achieve reliable data readout with very low $V_{PASS}$ values. Consider, for example, an array of eight-level memory cells, which are programmed to threshold voltages in the range of 0-3V. The nominal pass voltage in such an array would be on the order of 5V, in order to minimize the likelihood that a cell in an unselected word line would stop conducting due to over-programming. The disclosed techniques enable the R/W unit to reduce the pass voltage to around 4V, while maintaining a very low probability that a cell in an unselected word line will stop conducting. Even when the pass voltage is reduced to 3V, the majority of the cells in the unselected word lines will conduct (with the exception of the cells that are intentionally programmed to threshold voltages around 3V and cells that suffer from severe over-programming). Thus, the majority of cells can be read reliably with a negative effective read voltage. In any case, the disclosed techniques fall back to the nominal pass voltages in the event that a string does stop conducting.

In alternative embodiments, system 20 may use any other suitable technique that includes:

1. Reading a target memory cell while biasing the other memory cells in the string using nominal pass voltages.
2. Re-reading the target memory cell while biasing the other memory cells in the string using modified pass voltages, at least one of which is different from the corresponding nominal pass voltage.
3. Reconstructing the data based on the two read operations.

Setting Pass Voltages Based on Word Line Programming Status

In a typical N bits/cell MLC device, a given word line may be programmed with less than N bits per cell at a certain point in time. A memory cell or group of cells that are programmed with less than the maximum specified number of bits per cell is referred to as partially programmed. A memory cell or group of cells that are programmed with the maximum specified number of bits per cell is referred to as fully programmed.

Each MLC programming level (programming state) is associated with a certain range of threshold voltages (or other form of storage values). Typically, a partially-programmed word line does not occupy the (one or more) highest threshold voltage ranges. In the 2 bits/cell configuration of FIG. 4, for example, a given word line can be partially programmed with only one bit per cell by populating only programming levels 80A and 80B. At a later point in time, this word line may be programmed with the second bit by populating all four programming levels 80A . . . 80D, thus reaching the full 2 bits/cell density. As can be appreciated, the memory cells of a partially-programmed word line typically have relatively low threshold voltages. Thus, a memory cell in a partially-programmed word line is extremely unlikely to be affected by reduced pass voltage.

In some embodiments, when intending to read a certain target word line, R/W unit 36 selects whether to apply a nominal or different (e.g., reduced) pass voltage to a given unselected word line based on the programming status of this word line. Partially-programmed unselected word lines can usually be biased with low pass voltages, with little or no risk of affecting string conductance. Fully-programmed unselected word lines have a higher probability of affecting string conductance, e.g., because of cell over-programming, and are therefore biased with nominal pass voltages. An erased word line is also regarded as partially programmed in this context.

Figure 7:
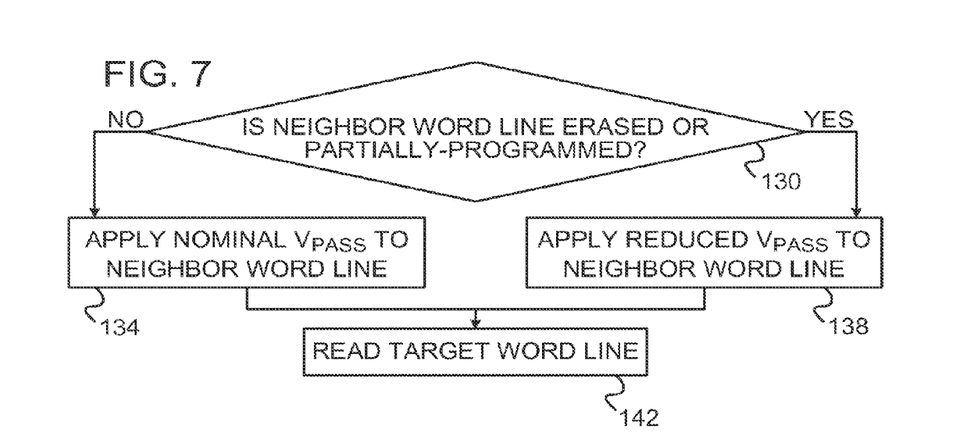

FIG. 7 is a flow chart that schematically illustrates a method for reading analog memory cells, in accordance with an embodiment of the present invention. The method begins with R/W unit 36 checking whether a given unselected word line is erased or partially programmed, at a programming status checking step 130. If not, i.e., if the word line is fully programmed, the R/W unit applies a nominal $V_{PASS}$ value to the word line, at a nominal biasing step 134. If the word line is erased or partially programmed, the R/W unit applies a reduced $V_{PASS}$ value to the word line, at a reduced biasing step 138. R/W unit 36 typically repeats the process of steps 130-138 for each unselected word line. The R/W unit reads the target word line while the unselected word lines are biased with the appropriate pass voltages, at a reading step 142.

The method of FIG. 7 enables the memory device to reduce at least some of the pass voltages, with little or no effect on reading performance. Unlike the methods of FIGS. 5 and 6 above, selective application of reduced pass voltages can be performed without additional read operations. For example, the R/W unit or MSP may keep a record as to how many bits per cell are programmed in each word line.

Memory Cell Pre-Programming to Intermediate Negative Programming Level

In some embodiments, R/W unit 36 pre-programs the memory cells of a certain erased word line to an intermediate level before storing data in the cells. For example, the cells in an erased word line may have threshold voltages in the range of −4V to −1V. Before storing data in these cells, the R/W unit may pre-program the cells to an intermediate programming level having threshold voltages in the range of −1.5V to −0.5V. This intermediate level typically occupies a range of negative threshold voltages, and is usually more compact (narrower) that the erased level. The above-mentioned voltage ranges are given purely by way of example, and any other suitable values can be used.

Pre-programming memory cells to an intermediate level has a number of advantages. For example, since the intermediate level occupies higher threshold voltages and is more compact than the erased level, the additional threshold voltage gained during data programming is smaller and more accurate. Thus, the resulting threshold voltage distributions are typically narrower. In addition, when using a Programming and Verification (P&V) process, the P&V process inherently compensates for cross-coupling interference that is already present when the cells are programmed. When a neighboring word line of a certain target word line is pre-programmed to an intermediate level, it already contributes some cross-coupling interference to the target word line. When the target word line is programmed, this interference component is inherently compensated for.

On the other hand, pre-programming a group of memory cells to an intermediate negative level typically involves setting a verification threshold to a negative value. Setting a negative read threshold is often unfeasible in many memory device configurations. As explained above, however, applying reduced pass voltages to unselected word lines can be viewed as setting a negative read threshold. In some embodiments, the R/W unit pre-programs the memory cells in a certain target word line to an intermediate negative level, and verifies the pre-programming by applying different (e.g., reduced) pass voltages to one or more unselected word lines.

Figure 8:
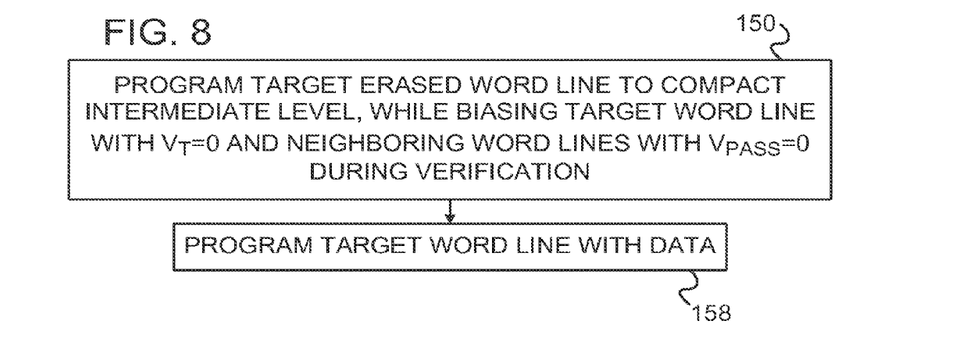
FIG. 8 is a flow chart that schematically illustrates a method for pre-programming analog memory cells, in accordance with an embodiment of the present invention.

FIG. 8 is a flow chart that schematically illustrates a method for pre-programming a certain erased word line, in accordance with an embodiment of the present invention. The method begins with R/W unit 36 pre-programming the memory cells of the erased word line (referred to as a target word line) to an intermediate level of negative threshold voltages, at a pre-programming step 150. The R/W unit applies a read voltage of $V_T=0$ to the erased word line, and $V_{PASS}=0$ to one or more of the unselected word lines (usually neighboring word lines). Alternatively, any other suitable small positive values of $V_T$ and small positive values of $V_{PASS}$ can also be used, such as 4V. This sort of biasing is equivalent to biasing the unselected word lines with nominal pass voltages and setting a negative value of $V_T$. After biasing the word lines, the R/W unit pre-programs the memory cells of the target word line, e.g., using an iterative P&V process.

The verification thresholds used in this programming process are non-negative, but are equivalent to negative verification thresholds due to the biasing scheme used. As a result, the cells of the target word line assume threshold voltages that fall in a relatively narrow range (e.g., −1.5V to −0.5V) of negative threshold voltages. At a later point in time, the R/W unit programs the pre-programmed word line with data, at a data programming step 158.

The pre-programming process of FIG. 8 may be performed at any stage during the memory cells' life cycle. In some embodiments, the target word line is pre-programmed before its neighboring word lines are programmed. At that stage, applying low $V_{PASS}$ values to the neighboring word lines is unlikely to affect string conductance.

Setting Pass Voltage as a Function of Read Voltage

Multi-level memory cells are typically read by performing multiple read operations using different read voltages (read thresholds) $V_T$, which are positioned in the boundary regions between adjacent programming levels. In the configuration of FIG. 4 above, for example, the memory cells can be read using three read voltages. One read voltage would be positioned between distributions 92A and 92B, another read voltage would be positioned between distributions 92B and 92C, and a third read voltage would be positioned between distributions 92C and 92D.

In some embodiments, R/W unit 36 sets the $V_{PASS}$ values of at least one unselected word line depending on the read voltage $V_T$. Typically although not necessarily, the $V_{PASS}$ value is increased as $V_T$ increases. In the configuration of FIG. 4, for example, a read operation whose $V_T$ is between distributions 92C and 92D would use a larger $V_{PASS}$ value than a read operation whose $V_T$ is between distributions 92B and 92C. This dependence can be applied in data readout operations as well as in programming verification operations.

This technique is advantageous, for example, in memory devices in which the maximum value of $V_T$ that can be applied to a word line is limited. Such a limit may be caused, for example, by the word line biasing circuitry or for any other reason. In this sort of situation, increasing the $V_{PASS}$ of one or more unselected word lines as a function of $V_T$ can increase the effective read voltage $V_{EFF}$ beyond the maximum value of $V_T$ that can be applied to the selected word line. As a result, the achievable range of threshold voltages ("the threshold voltage window") is not limited by the word line biasing circuitry and can be increased to improve performance.

The R/W unit may set the value of $V_{PASS}$ based on $V_T$ according to any suitable function or dependence. For example, the dependence may be linear, i.e., $V_{PASS}=V_T+a\cdot V_T$. When $V_{EFF}$ is given by $V_{EFF}=V_T+b\cdot V_{PASS}$, this linear dependence increases the threshold voltage range by a factor of $1+a\cdot b$. Alternatively, any other suitable dependence can also be used.

Figure 9:
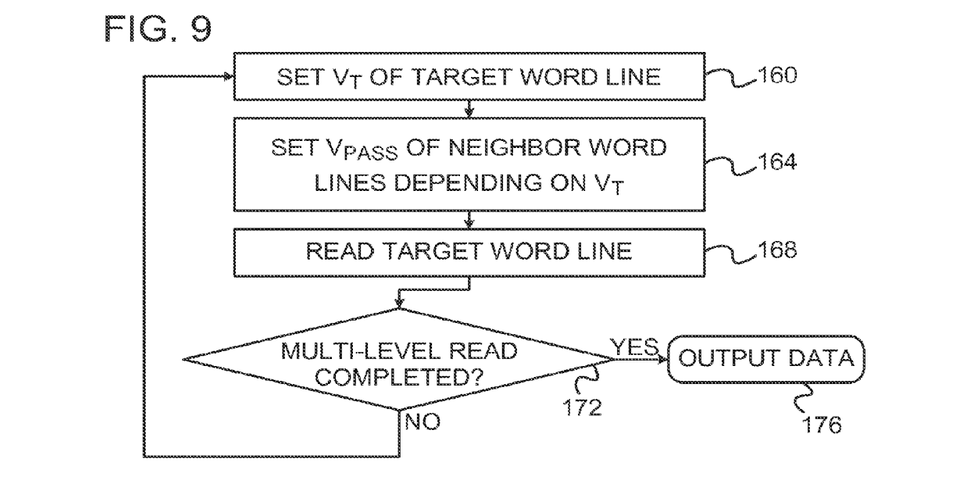
FIG. 9 is a flow chart that schematically illustrates a method for reading multi-level analog memory cells, in accordance with an embodiment of the present invention.

FIG. 9 is a flow chart that schematically illustrates a method for reading a word line of multi-level analog memory cells (referred to as a target word line), in accordance with an embodiment of the present invention. In this method, R/W unit 36 reads the multi-level cells by applying a sequence of read operation, each with a different read voltage.

The method begins with R/W unit 36 setting a read voltage $V_T$ for reading the target word line, at a read voltage setting step 160. The R/W unit sets the $V_{PASS}$ values of one or more unselected word lines (e.g., word lines that neighbor the target word line) based on the $V_T$ value to be used, at a pas voltage setting step 164. Any dependence of $V_{PASS}$ on $V_T$, such as the linear dependence defined above, can be used. The R/W unit then reads the memory cells in the target word line using the set values of $V_{PASS}$ and $V_T$, at a word line reading step 168.

The R/W unit checks whether additional read operations are to be performed as part of the multi-level read sequence, at a read completion checking step 172. If all read operations are completed, the R/W unit outputs the read results to MSP 40, at an output step 176, and the method terminates. Otherwise, the method loops back to step 160 above, in which the R/W unit prepares for the next read operation and sets the VT value accordingly.

Improving Read Voltage Resolution Using Pass Voltage Adjustment

In some embodiments, the read voltage (or read threshold) generation circuitry in R/W unit 36 is able to produce VT at a limited resolution. In these embodiments, the R/W unit can read memory cells in a certain word line at a finer resolution, by adjusting the pass voltages of one or more unselected word lines. In other words, when a read threshold is settable only at a certain resolution, the R/W unit jointly sets the read threshold and one or more pass voltages, so as to sense the cell threshold voltages at a finer resolution.

Consider, for example, a memory device that is able to generate read voltages (read thresholds) at 30 mV steps. In such a device, it may be desirable to check if a certain memory cell becomes conductive at $V_T=3.07V$ and $V_{PASS}=7V$. Assume also that in this memory device the effective read voltage is given by $V_{EFF}=V_T+0.1 \cdot V_{PASS}$. In order to produce equivalent conditions to $V_{EFF}=3.07V$ and $V_{PASS}=7V$, the R/W unit may set $V_T=3V$ and $V_{PASS}=7.07V$, or alternatively set $V_T=3.03V$ and $V_{PASS}=6.77V$. In both cases, the effective read voltage is set at high resolution even though $V_T$ is set at 30 mV granularity.

ADDITIONAL EMBODIMENTS AND VARIATIONS

The methods described throughout this patent application manipulate the pass voltages of one or more unselected word lines, in order to read a certain selected (target) word line. In all of these methods, pass voltage adjustment can be applied to any desired subset of one or more unselected word lines. In some embodiments, pass voltage modification is applied to one or both word lines that are direct neighbors of the selected word line. Modifying the pass voltages of direct neighbors is often preferable because:

The impact of the pass voltages of neighboring word lines on the effective read voltage of the target word line is usually dominant. The effect of more distant word lines is often weaker.

Memory devices are often programmed in monotonic (ascending or descending) order of word lines. In some devices, the programming order alternates back and forth between word lines and applies partial programming at each stage. In either case, when a given word line is programmed and verified, one or both neighboring word lines are likely to be partially-programmed or not programmed at all. Applying reduced pass voltages to the partially-programmed word lines is unlikely to affect string conductance.

Nevertheless, pass voltage modification may be applied to any desired set of unselected word lines, or even to all word lines. Generally, different word lines may be biased with different or similar pass voltages, as desired.

In some cases, implementing circuitry that applies multiple different voltages to different word lines may complicate the design of the R/W unit and may also cause performance degradation (e.g., increase reading time). In an example embodiment, the R/W unit design can be simplified by applying the read voltage $V_T$ both to the selected (target) word line and to one or both neighbor word lines. Since $V_T$ is typically lower than the nominal $V_{PASS}$, applying $V_T$ to an unselected word line is equivalent to reducing its pass voltage. Biasing a neighboring word line with $V_T$ has the advantage of eliminating the circuitry needed for generating an additional voltage value. This technique is particularly applicable when the neighbor word line is not yet programmed or partially-programmed, as explained above.

In the embodiments described herein, the $V_{PASS}$ modification process is carried out by R/W unit 36 internally to the memory device. This configuration was described, however, purely for the sake of conceptual clarity. The methods and systems described herein are in no way limited to implementation internally to the memory device circuitry. In alternative embodiments, some or all of the $V_{PASS}$ modification process can be carried out by MSP 40 or other controller that is separate from the memory device. For example, the MSP may determine the $V_{PASS}$ voltages to be applied in a given read operation and indicate these voltages to the memory device. In some embodiments, the memory device and MSP support a command interface, which comprises one or more commands that instruct the memory device to apply certain pass voltages. These commands may specify, for example, the pass voltages to be applied and/or the word lines to which they are to be applied. Any of the methods described in this patent application can be partitioned between the memory device and the MSP (or other controller, or the host) in any desired manner.

In some of the embodiments described herein, a group of memory cells are read with $V_T=0V$ and a reduced $V_{PASS}$, because $V_T=0V$ is the lowest read voltage that can be set by the memory device. Some memory devices, however, may have a minimal $V_T$ that is somewhat larger than 0V. Thus, in alternative embodiments, the R/W unit may read the memory cells with $V_T=\epsilon>0$ and reduced $V_{PASS}$, wherein $\epsilon$ denotes the minimum readable storage value, i.e., the lowest value of read voltage that is supported by the memory device circuitry.

Another possible way to increase the observable threshold voltage of a given target word line is to bias a neighboring word line with a pass voltage that is in the vicinity of its threshold voltage. Thus, in an embodiment, the R/W unit may read a target word line by (1) programming all the cells of a neighboring word line to a compact range of storage values, (2) biasing the neighboring word line with a pass voltage in the vicinity of this range, and (3) reading the target word line.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. An apparatus, comprising:
    a memory array that includes a plurality of memory-cell word lines;
    a control unit configured to:
      pre-program an erased target one of the plurality of memory-cell word lines prior to programming the target memory-cell word line; and
      verify pre-programming of the target memory-cell word line by applying a first pass voltage to a neighboring one of the plurality of memory-cell word lines, wherein the first pass voltage is different from a second pass voltage applied to verify the programming.

2. The apparatus of claim 1, wherein the plurality of memory-cell word lines includes NAND Flash memory cells located within strings of memory cells, and wherein memory cells of the target memory-cell word line are located within the same strings as memory cells of the neighboring memory-cell word line.

3. The apparatus of claim 1, wherein the control unit is configured to pre-program the target memory-cell word line prior to programming the neighboring memory-cell word line.

4. The apparatus of claim 1, wherein the control unit is configured to read the target memory-cell word line after the programming by applying a third pass voltage to the neighboring memory-cell word line, wherein the third pass voltage is different than the second pass voltage.

5. The apparatus of claim 1, wherein the control unit is configured to pre-program the erased target memory-cell word line by applying a gate voltage to memory cells in the target memory-cell word line, wherein the gate voltage has the same voltage as the first pass voltage.

6. The apparatus of claim 5, wherein the gate voltage and the first pass voltage are substantially 0V.

7. The apparatus of claim 1, wherein the control unit is configured to pre-program the erased target memory-cell word line by applying a gate voltage to memory cells in the target memory-cell word line, and wherein the gate voltage is less than the first pass voltage.

8. The apparatus of claim 1, wherein the control unit is configured to pre-program the erased target memory-cell word line to an intermediate threshold voltage, wherein the intermediate threshold voltage is a negative voltage between an erased threshold voltage of the target memory-cell word line and a programmed threshold voltage of the target memory-cell word line.

9. A method, comprising:
  prior to programming an erased target memory cell, pre-programming the erased target memory cell such that the target memory cell has an intermediate, negative threshold voltage; and
  verifying the pre-programming without applying a negative gate voltage to the target memory cell.

10. The method of claim 9, wherein the verifying includes applying a reduced pass voltage to one or more neighboring memory cells of the target memory cell, wherein the reduced pass voltage is less than a pass voltage applied while verifying the programming of the target memory cell.

11. The method of claim 10, wherein the verifying includes applying a gate voltage to the target memory cell that is the same as the reduced pass voltage.

12. The method of claim 10, further comprising:
  after programming the target memory cell, reading the target memory cell by applying another pass voltage to the one or more neighboring memory cells, wherein the other pass voltage is less than the pass voltage applied while verifying the programming of the target memory cell.

13. The method of claim 9, wherein the pre-programming is performed prior to programming a neighboring memory cell within a string that includes the target memory cell.

14. The method of claim 9, wherein the verifying includes applying a gate voltage to the target memory cell of substantially 0V.

15. An apparatus, comprising:
  a plurality of memory-cell strings;
  control unit configured to:
    erase one of the plurality of memory-cell strings;
    pre-program a selected memory cell within the erased memory-cell string to an intermediate level;
    verify pre-programming the selected memory cell including biasing an unselected memory cell within the memory-cell string with a first pass voltage;
    program the selected memory cell; and
    verify programming of the selected memory cell including biasing the unselected memory cell with a second pass voltage, wherein the second pass voltage is different than the first pass voltage.

16. The apparatus of claim 15, wherein the control unit is configured to pre-program the unselected memory cell prior to programming the selected memory cell.

17. The apparatus of claim 15, wherein the control unit is configured to verify pre-programming of the selected memory cell including applying a gate voltage to the selected memory cell, wherein the gate voltage is the same as the first pass voltage.

18. The apparatus of claim 17, wherein the gate voltage is not a negative voltage.

19. The apparatus of claim 15, wherein the control unit is further configured to read the selected memory cell including biasing the unselected memory cell with a third pass voltage different than the second pass voltage.

20. The apparatus of claim 15, wherein the first pass voltage is less than the second pass voltage.

* * * * *